United States Patent
Tan et al.

(10) Patent No.: US 10,063,232 B1
(45) Date of Patent: Aug. 28, 2018

(54) DIGITALLY CONTROLLED IMPEDANCE CALIBRATION FOR A DRIVER USING AN ON-DIE REFERENCE RESISTOR

(71) Applicant: Xilinx, Inc., San Jose, CA (US)

(72) Inventors: Sing-Keng Tan, San Jose, CA (US); Xiaobao Wang, Cupertino, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/703,767

(22) Filed: Sep. 13, 2017

(51) Int. Cl.
*H03K 19/0185* (2006.01)
*H03K 19/003* (2006.01)
*H04L 25/02* (2006.01)
*H03K 19/00* (2006.01)

(52) U.S. Cl.
CPC ... *H03K 19/00384* (2013.01); *H03K 19/0005* (2013.01); *H03K 19/0185* (2013.01); *H04L 25/0278* (2013.01)

(58) Field of Classification Search
CPC ............... H03K 19/0185; H03K 19/018571
See application file for complete search history.

(56) References Cited

U.S. PATENT DOCUMENTS

| 6,445,245 | B1 | 9/2002 | Schultz et al. |
| 6,489,837 | B2 | 12/2002 | Schultz et al. |
| 6,963,218 | B1 | 11/2005 | Alexander et al. |
| 7,653,505 | B1 | 1/2010 | Simmons et al. |
| 7,696,775 | B2 * | 4/2010 | Jian .............. G11C 7/1051 326/30 |
| 8,065,570 | B1 | 11/2011 | Simmons et al. |
| 8,222,918 | B1 | 7/2012 | Tan |

* cited by examiner

*Primary Examiner* — Jeffrey Zweizig
(74) *Attorney, Agent, or Firm* — Robert M. Brush

(57) ABSTRACT

A transmitter includes: a driver circuit having a pull-up circuit, and a pull-down circuit, coupled to an output pad; a digitally controlled impedance (DCI) calibration circuit having a first reference driver, a second reference driver, and a reference resistor, the DCI calibration circuit configured to: generate a value for a first code by calibrating a first impedance in the first reference driver against the reference resistor; generate a value for a second code by calibrating a second impedance in the second reference driver against the first impedance; and adjust the value of the first code to match the first impedance with the second impedance; and a pre-driver circuit configured to supply the first code and the second code to the driver circuit for adjusting output impedance of the pull-up circuit and the pull-down circuit.

20 Claims, 15 Drawing Sheets

| ODT | Data | EN<i> | Pcode$_i$ | Ncode$_i$ |
|---|---|---|---|---|
| X | X | 0 | High-z | High-z |
| 0 | 0 | 1 | DCI_Pcode | Tie_low |
| 0 | 1 | 1 | Tie_low | DCI_Ncode |
| 1 | High-z | 1 | DCI_Pcode | DCI_NCode |

DIGITALLY CONTROLLED IMPEDANCE CALIBRATION FOR A DRIVER USING AN ON-DIE REFERENCE RESISTOR

TECHNICAL FIELD

Examples of the present disclosure generally relate to electronic circuits and, in particular, to digitally controlled impedance calibration for a driver using an on-die reference resistor.

BACKGROUND

A digitally controlled impedance (DCI) calibration scheme can be used to compensate for changes in pull-up and pull-down impedances in an output driver (hereinafter "driver"). The driver pull-up and pull-down impedances are calibrated against a precision reference resistor, which is located external to the integrated circuit (IC) die (e.g., on a printed circuit board (PCB) to which the IC die is attached). The driver pull-up and pull-down impedances are calibrated to compensate for process variation, as well as for temperature and supply voltage fluctuations (generally process, voltage and temperature (PVT) variations). The external precision reference resistor can have a small resistance variation from the nominal value. The driver can be designed to ensure that the range in drive strength covers the entire range of the variation in resistance of the external precision reference resistor.

In some cases, it is desirable to use an on-die reference resistor with a DCI calibration scheme. For example, for a High Bandwidth Memory (HBM) interface, where the memory controller and stack dynamic random access memory (DRAM) IC are placed beside each other in the same package. The interface between memory controller and DRAM is through silicon interposer, not through the package and PCB. To save package pin and PCB board real estate, the on-die reference resistor is desired.] An on-die reference resistor has a larger variation in resistance from the nominal value as compared with an external reference resistor due to process variation. That is, the difference between the fast resistor process corner and the slow resistor process corner for an on-die reference resistor is larger than the variation in resistance of an external reference resistor. Designing a driver to have a range in drive strength that covers the entire range of an on-die reference resistor consumes more power and die area as compared to an external reference resistor. It is desirable to provide a driver and associated DCI calibration scheme that consumes less power and less die area when using an on-die reference resistor.

SUMMARY

Techniques for digitally controlled impedance calibration for a driver using an on-die reference resistor are described. In an example, a transmitter includes: a driver circuit having a pull-up circuit, and a pull-down circuit, coupled to an output pad; a digitally controlled impedance (DCI) calibration circuit having a first reference driver, a second reference driver, and a reference resistor, the DCI calibration circuit configured to: generate a value for a first code by calibrating a first impedance in the first reference driver against the reference resistor; generate a value for a second code by calibrating a second impedance in the second reference driver against the first impedance; and adjust the value of the first code to match the first impedance with the second impedance; and a pre-driver circuit configured to supply the first code and the second code to the driver circuit for adjusting output impedance of the pull-up circuit and the pull-down circuit.

In another example, an integrated circuit (IC) includes: an output pad; a reference resistor; a driver circuit having a pull-up circuit, and a pull-down circuit, coupled to the output pad; a digitally controlled impedance (DCI) calibration circuit having a first reference driver and a second reference driver, the DCI calibration circuit configured to: generate a value for a first code by calibrating a first impedance in the first reference driver against the reference resistor; generate a value for a second code by calibrating a second impedance in the second reference driver against the first impedance; and adjust the value of the first code to match the first impedance with the second impedance; and a pre-driver circuit configured to supply the first code and the second code to the driver circuit for adjusting output impedance of the pull-up circuit and the pull-down circuit.

In another example, a method of calibrating a driver circuit in an integrated circuit includes: generating a value for a first code by calibrating a first impedance in a first reference driver against a reference resistor in the integrated circuit; generating a value for a second code by calibrating a second impedance in a second reference driver against the first impedance; adjusting the value of the first code to match the first impedance with the second impedance; supplying the first code and the second code to the driver circuit for adjusting output impedance of a pull-up circuit and a pull-down circuit therein.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
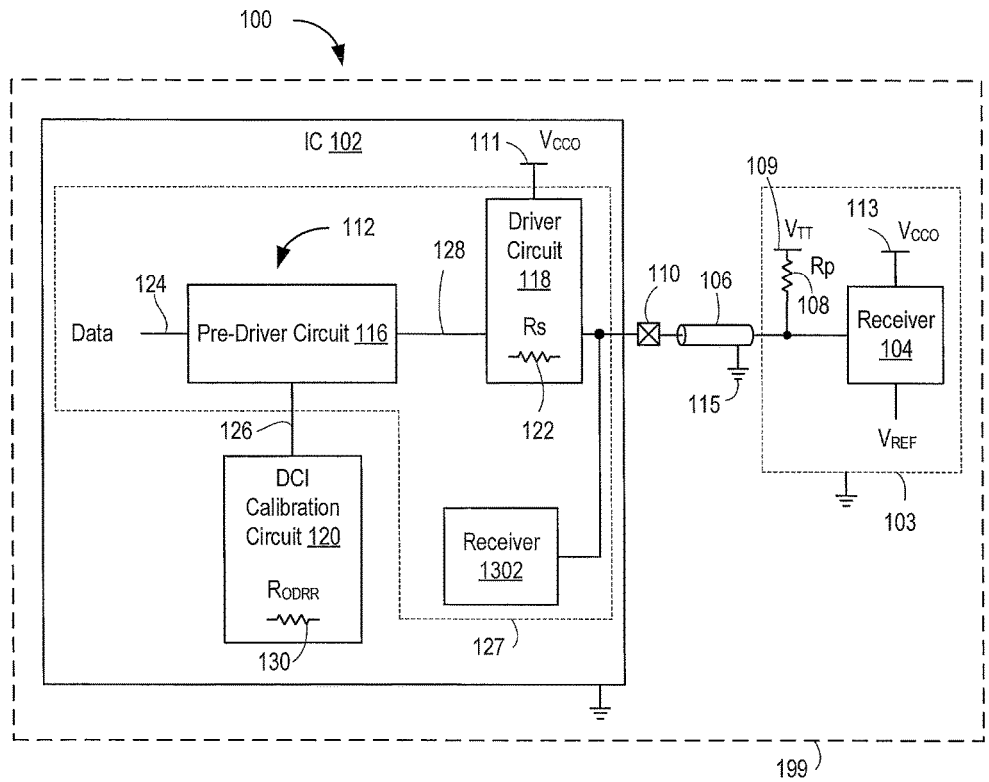
FIG. 1 is a block diagram depicting a communication system according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

FIG. 1 is a block diagram depicting a communication system 100 according to an example. The communication system 100 includes a transmitter 112 coupled to a receiver 104 through a transmission line 106. The transmitter 112 is disposed in an integrated circuit (IC) 102. The transmitter 112 is electrically coupled to a pad 110 of the IC 102, which in turn is electrically coupled to one end of the transmission line 106. The pad 110 can be electrically coupled to the transmission line 106 through a solder ball, pin, or the like of an IC package. The receiver 104 is coupled to the other end of the transmission line 106. The receiver 104 can be disposed in another IC 103. The transmission line 106 can be a stripline, microstrip, or the like. The transmission line 106 can be formed on a printed circuit board (PCB), IC package substrate, interposer, or the like to which the IC 102 and the receiver 104 are attached. In some examples (discussed further below), the IC 102 can also include a receiver 1302 coupled to the pad 110. The transmitter 112 and/or the receiver 1302 can be part of an input/output (IO) circuit 127. The IC 102 can include a plurality of IO circuits 127. In an example, the IC 102 and the IC 103 are electrically and mechanically mounted to an interposer 199 in an IC package. The transmission line 106 is formed on the interposer 199 to electrically connect the driver circuit 118 to the receiver 104.

A parallel termination resistor 108 having a value Rp is disposed at the receiver end of the transmission line 106. In the example, the resistor 108 is coupled between the transmission line 106 and a supply node 109, which supplies a voltage $V_{TT}$. The voltage $V_{TT}$ is typically equal to or approximately equal to a reference voltage ($V_{REF}$) of the receiver 104. The resistor 108 is optional and, when implementing some input/output (IO) standards, is omitted. When present, the value Rp of the resistor 108 is typically equal to or approximately equal to the characteristic impedance ($z_0$) of the transmission line 106. In some examples, the resistor 108 can be replaced with a split-termination circuit having two resistors, one coupled between $V_{CCO}$ and the transmission line 106, and the other coupled between the transmission line 106 and ground. The voltage $V_{CCO}$ is a supply voltage provided by supply nodes 111 and 113 respectively coupled to the driver circuit 118 and the receiver 104. As used herein, "ground" is a reference voltage, supplied by a ground node 115 common to all components, which is typically zero volts, but can be any other potential that provides a reference to the supply voltages described herein. For purposes of clarity by example, ground is assumed to be zero volts throughout this description. While a single resistor 108 is shown, in other examples, an equivalent split-termination circuit can be implemented in the IC 103.

The transmitter 112 includes a pre-driver circuit 116 and a driver circuit 118. The transmitter 112 is coupled to a digitally controlled impedance (DCI) calibration circuit 120. In an example, the DCI calibration circuit 120 is coupled to a transmitter in each of a plurality of IO circuits 127 (i.e., the DCI calibration circuit 120 is shared by a group of IO circuits 127). The driver circuit 118 includes an output electrically coupled to the pad 110. The driver circuit 118 functions as a voltage-mode driver that uses single-ended transmission to transmit a signal to the receiver 104. The driver circuit 118 has an output impedance 122, having a value Rs, coupled in series with the transmission line 106. The output impedance 122 provides a series termination at the transmitter end of the transmission line 106.

The pre-driver circuit 116 includes an input 124 that receives a data signal (Data) and an input electrically coupled to an output of the DCI calibration circuit 120 (referred to as connection 126). The pre-driver circuit 116 includes an output electrically coupled to an input of the driver circuit 118 (referred to as connection 128). The data signal is a digital logic signal that varies between a logic high voltage and a logic low voltage with reference to a clock signal (not shown). The data signal is supplied by another circuit in the IC 102 (not shown). The DCI calibration circuit 120 supplies digital control signals (hereinafter "control signals") to the pre-driver circuit 116 through the connection 126. The control signals generated by the DCI calibration circuit 120 are discussed further below. The pre-driver circuit 116 generates input signals for the driver circuit 118 through the connection 128. The input signals of the driver circuit 118 are discussed further below. The DCI calibration circuit 120 includes an on-die reference resistor 130 having a value $R_{ODRR}$. The DCI calibration circuit 120 calibrates the output impedance 122 of the driver circuit 118 against the one-die reference resistor 130, as described further herein.

Figure 2:
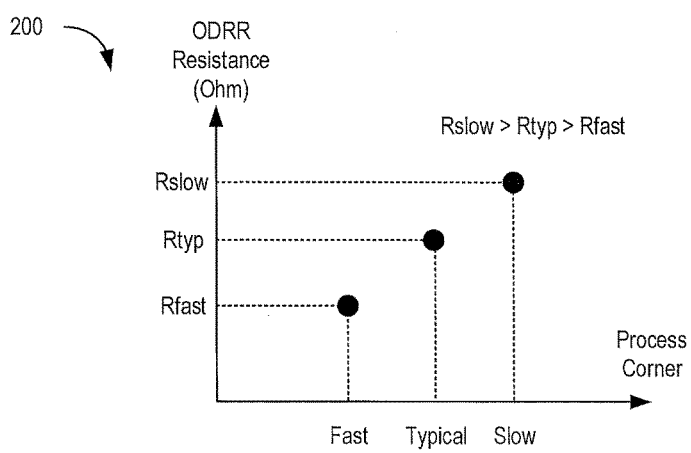
FIG. 2 is a graph relating the resistance of an on-die reference resistor and a resistance process corner according to an example.

FIG. 2 is a graph 200 relating the resistance of the on-die reference resistor 130 and a resistance process corner (hereinafter "process corner") according to an example. The graph 200 includes a vertical axis representing the resistance ODRR of the on-die reference resistor 130 in ohms and a horizontal axis qualitatively representing the process corner. The graph 200 shows ODRR values Rslow, Rtyp, and Rfast for slow, typical, and fast process corners, respectively. As shown in the graph 200, Rslow is greater than Rtyp, which in turn is greater than Rfast. Rtyp is equal to or approximately equal to a resistance from which a specific set of termination resistances can be formed that are commonly used in different IO standards. For example, Rtyp can be equal to or approximately equal to 240 ohms, from which termination resistances equal to or approximately equal to 40, 48, 60, 80, 120, and 240 can be formed. The resistance ODRR can vary from Rtyp depending on whether the on-die reference resistor 130 is in the fast process corner or the slow process corner.

Figure 3A:
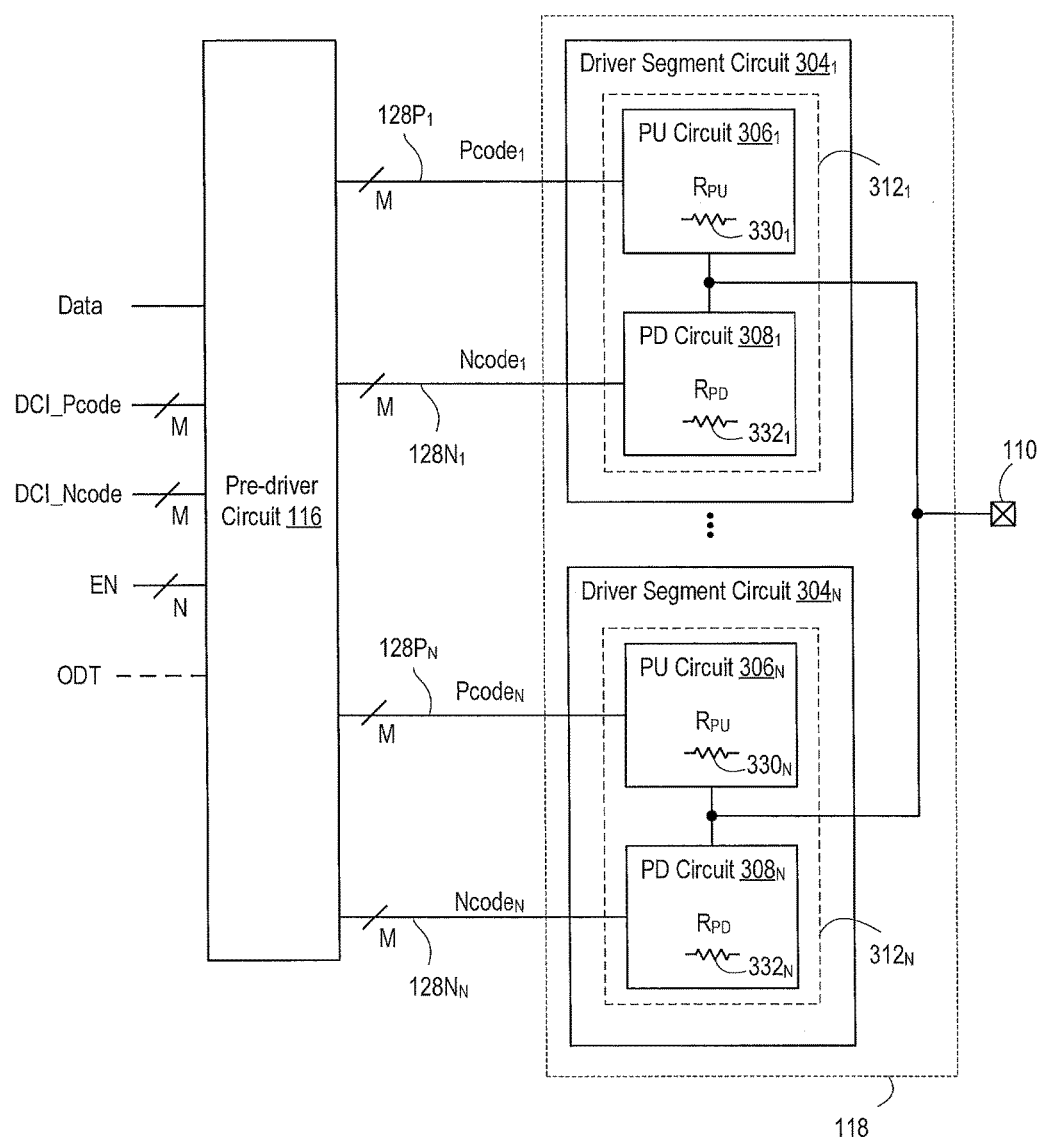
FIG. 3A is a block diagram depicting a driver circuit according to an example.

FIG. 3A is a block diagram depicting the driver circuit 118 in more detail according to an example. The driver circuit 118 includes one or more driver segment circuits 304, shown as driver segment circuits $304_1 \ldots 304_N$, where N is a positive integer. The driver segment circuits $304_1 \ldots 304_N$ respectively include pull-up (PU) circuits $306_1 \ldots 306_N$ and pull-down (PD) circuits $308_1 \ldots 308_N$. The PU circuits $306_1 \ldots 306_N$ respectively pair with the PD circuits $308_1 \ldots 308_N$ to form push-pull drivers $312_1 \ldots 312_N$. Each driver segment circuit $304_i$ (where index i∈[1,N]) includes a PU circuit $306_i$ and corresponding PD circuit $308_i$. Each pair of PU/PD circuits ($306_i$, $308_i$) forms a push-pull driver $312_i$ having an output electrically coupled to the pad 110. When turned on, each PU circuit $306_i$ supplies current in a direction to pull the pad 110 to a higher voltage. Each PU circuit $306_i$ provides an output impedance $330_i$ having a value $R_{PU}$. When turned on, each PD circuit $308_i$ supplies current in a direction to pull the pad 110 to a lower voltage. Each PD circuit $308_i$ provides an output impedance $332_i$ having a value $R_{PD}$. Each PU circuit $306_i$, PD circuit $308_i$, and corresponding push-pull driver $312_i$ is further segmented as shown in FIG. 3B.

The pre-driver circuit 116 includes M-bit outputs electrically coupled to M-bit inputs of the PU circuits $306_1 \ldots 306_N$ through respective connections $128P_1 \ldots 128P_N$. The pre-driver circuit 116 includes M-bit outputs electrically coupled to M-bit inputs of the PD circuits $308_1 \ldots 308_N$ through respective connections $128N_1 \ldots 128N_N$. The pre-driver circuit 116 supplies $Pcode_1 \ldots Pcode_N$ signals through the connections $128P_1 \ldots 128P_N$, respectively. The pre-driver circuit 116 supplies $Ncode_1 \ldots Ncode_N$ signals through the connections $128N_1 \ldots 128N_N$, respectively.

Figures 3B, 3C:
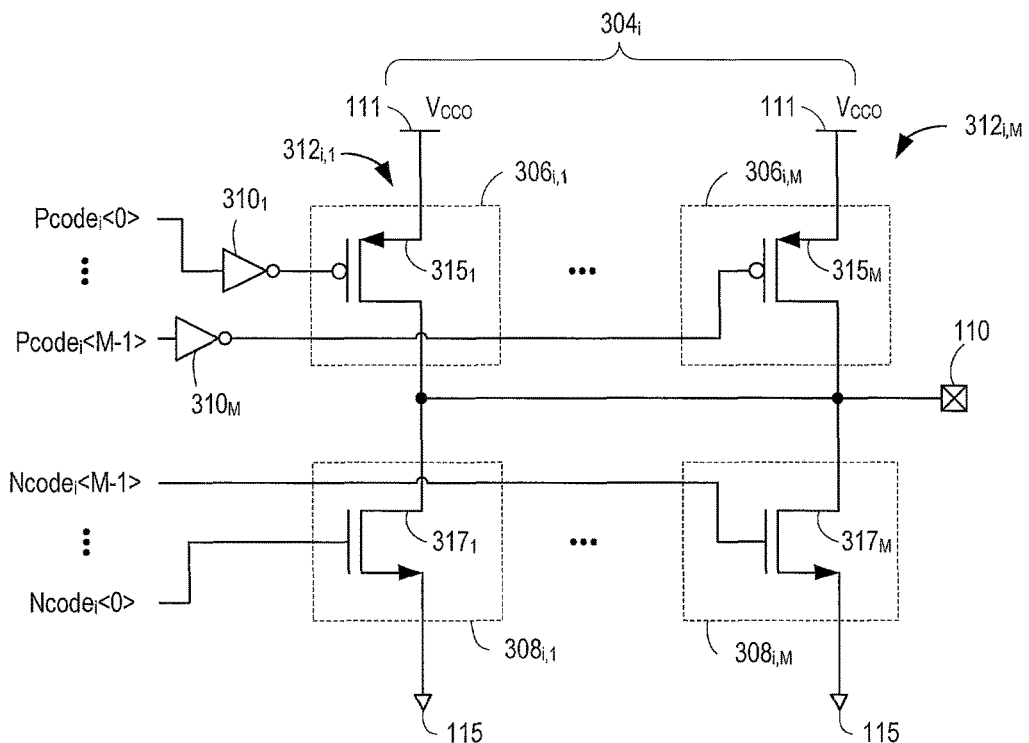
FIG. 3B is a schematic diagram depicting a driver segment circuit according to an example.
FIG. 3C shows a table illustrating the function performed by a pre-driver circuit according to an example.

FIG. 3B is a schematic diagram depicting a driver segment circuit $304_i$ according to an example. The driver segment circuit $304_i$ includes p-channel field effect transistors (FETs) $315_1 \ldots 315_M$ (e.g., p-type metal oxide semiconductor FETs (MOSFETs)), n-channel FETs $317_1 \ldots 317_M$ (e.g., n-type MOSFETs), and inverters $310_1 \ldots 310_M$, where M is a positive integer. A p-channel transistor is a transistor that uses holes as the majority carrier to carry its channel current. An n-channel transistor is a transistor that uses electrons as the majority carrier to carry its channel current. The PU circuit $306_i$ is segmented into PU circuits $306_{i,1} \ldots 306_{i,M}$, where each PU circuit $306_{i,k}$ (where index k∈[1,M]) includes a respective one of the p-channel transistors $315_1 \ldots 315_M$. Likewise, the PD circuit $308_i$ is segmented into PD circuits $308_{i,1} \ldots 308_{i,M}$, where each PD circuit $306_{i,k}$ includes a respective one of the n-channel transistors $317_1 \ldots 317_M$. As such, the push-pull driver $312_i$ is segmented into push-pull drivers $312_{i,1} \ldots 312_{i,M}$.

For each push-pull driver $312_{i,k}$, a source of the p-channel transistor $315_k$ is coupled to the supply node 111, and a source of the n-channel transistor $317_k$ is coupled to the ground node 115. Drains of the transistors $315_k$, and $317_k$, are coupled to the pad 110. A gate of the n-channel transistor $317_k$ receives the $(k-1)^{st}$ bit of the signal $Ncode_i$ (i.e., $Ncode_i$<k−1> of Ncode<M−1:0>). A gate of p-channel transistor $315_k$ is coupled to an output of the inverter $310_k$. An input of inverter $310_k$ receives the $(k-1)^{st}$ bit of the signal $Pcode_i$ (i.e., $Pcode_i$<k−1> of Pcode<M−1:0>). The $Pcode_i$ signal supplies an M-bit Pcode that either turns on a certain number of the PU circuits $306_{i,1} \ldots 306_{i,M}$ or turns off all of the PU circuits $306_{i,1} \ldots 306_{i,M}$. The $Ncode_i$ signal supplies an M-bit Ncode that either turns on a certain number of the PD circuits $308_{i,1} \ldots 308_{i,M}$ or turns off all of the PD circuits $308_{i,1} \ldots 308_{i,M}$.

Returning to FIG. 3A, the pre-driver circuit 116 includes inputs that receive the data signal, a DCI_Pcode signal, a DCI_Ncode signal, and an enable (EN) signal. The DCI_Pcode signal is an M-bit digital signal. Likewise, the DCI_Ncode signal is an M-bit digital signal. The EN signal is an N-bit digital signal. The DCI_Pcode, DCI_Ncode, and EN signals are supplied by the DCI calibration circuit 120, as described further below. In general, for each driver segment circuit $304_i$, the pre-driver 116 supplies a Pcode and an Ncode based on the data signal, the DCI_Pcode, the DCI_Ncode, and the EN signal. The DCI_Pcode signal supplies a DCI_Pcode value for turning on a certain number of the PU circuits $306_{i,1} \ldots 306_{i,M}$ in each driver segment circuit $304_i$. The DCI_Ncode signal supplies a DCI_Ncode value for turning on a certain number of the PD circuits $308_{i,1} \ldots 308_{i,M}$ in each driver segment circuit $304_i$. The EN signal supplies an EN code that enables a certain number of the driver segment circuits 304.

In particular, the EN code can be a code having zero or more logic-high bits that enable a respective zero or more of the driver segment circuits 304. For each enabled driver segment circuit 304, the pre-driver 116 supplies P- and N-codes that turn on PU- and/or PD-leg(s) therein (i.e., each enabled driver segment circuit 304 supplies an output drive voltage and current to the pad 110). For each disabled driver segment circuit 304, the selection circuit 302 supplies P- and N-codes that turn off all PU- and PD-legs therein (i.e., each disabled driver circuit 304 has a high-impedance connection to the pad 110).

FIG. 3C shows a table 320 illustrating the function performed by the pre-driver circuit 116. The table 320 includes columns for Data, EN<i>, $Pcode_i$, and $Ncode_i$ (on-die termination (ODT) is discussed further below). When EN<i> is logic-low, $Pcode_i$ and $Ncode_i$ are high-impedance (High-z) regardless of the value of Data. When EN<i> is logic-high and Data is logic-low, $Pcode_i$ is set to the DCI_Pcode and $Ncode_i$ is set to Tie_low (i.e., all bits of $Ncode_i$ are set to logic low). When EN<i> is logic-high and Data is logic-high, $Pcode_i$ is set to Tie_low and $Ncode_i$ is set to the DCI_Ncode. The pre-driver circuit 116 can be implemented using logic gates, inverters, buffers, three-state logic, and/or the like that achieve the functionality described herein and shown by the table 320. The pre-driver circuit 116 can also perform other functions using appropriate circuits, such as level-shifting using level-shifting circuits.

Referring to FIGS. 3A-3C, in operation, each logic-high bit of $Pcode_i$<M−1:0> turns on a respective p-channel transistor $315_{i,M} \ldots 315_{i,1}$, and each logic-low bit of $Pcode_i$<M−1:0> turns off a respective p-channel transistor $315_{i,M} \ldots 315_{i,1}$. Likewise, each logic-high bit of $Ncode_i$<M−1:0> turns on a respective n-channel transistor $317_{i,M} \ldots 317_{i,1}$, and each logic-low bit of $Ncode_i$<M−1:0> turns off a respective n-channel transistor $317_{i,M} \ldots 317_{i,1}$. For a given overdrive voltage ($V_{OD}$), each p-channel transistor $315_k$ is structured to have a certain output impedance $ROUT_k$ over a range of source-to-drain current ($I_{SD}$) and a range of source-to-drain voltage ($V_{SD}$). Likewise, for a given overdrive voltage ($V_{OD}$), each n-channel transistor $317_k$ is structured to have a certain output impedance $ROUT_k$ over a range of drain-to-source current (IDS) and a range of drain-to-source voltage ($V_{DS}$). In an example, the output impedances $ROUT_1 \ldots ROUT_M$ of the p-channel transistors $315_1 \ldots 315_M$, and the n-channel transistors $317_1 \ldots 317_M$, are binary-weighted (i.e., each output impedance $ROUT_k$ is twice as large as the output impedance $ROUT_{k+1}$).

As described further below, the DCI calibration circuit 120 sets the DCI_Pcode, DCI_Ncode, and the EN code to control the value Rs for the output impedance 122 of the driver circuit 118 to equal or approximately equal a target value (e.g., a value equal to or approximately equal to $z_0$). The DCI_Pcode sets the value $R_{PU}$ of the output impedances 330 in the enabled driver segment circuits 304. The DCI_Ncode sets the value $R_{PD}$ of the output impedances 332 in the enabled driver segment circuits 304. In the pull-up phase, the output impedances 330 of the enabled driver segment circuits 304 combine to provide the output impedance 122 of the driver circuit 118. That is, the resistance Rs is equal to $R_{PU}/n$, where $n \in [1, N]$ is the number of enabled driver segment circuits 304. In the pull-down phase, the output impedances 332 of the enabled driver segment circuits 304 combine to provide the output impedance 122 of the driver. That is, the resistance Rs is equal to $R_{PD}/n$, where $n \in [1, N]$ is the number of enabled driver segment circuits 304. The output impedances 330 and 332 of the driver segment circuits 304 are affected by PVT variations. To compensate, the DCI calibration circuit 120 calibrates the value of $R_{PU}$ and $R_{PD}$ against the value $R_{ODRR}$ of the on-die reference resistor 130.

As shown in FIG. 2, the on-die reference resistor 130 can have a wide resistance range due to process variation. When the on-die reference resistor 130 is in the fast process corner, the DCI calibration circuit 120 calibrates $R_{PU}$ and $R_{PD}$ against Rfast, which increases the drive strength of each driver segment circuit $304_i$ from the nominal value. When the on-die reference resistor 130 is in the slow process corner, the DCI calibration circuit 120 calibrates $R_{PU}$ and $R_{PD}$ against Rslow, which decreases the drive strength of each driver segment $304_i$ from the nominal value. Thus, the worst case drive strength occurs when the on-die reference resistor 130 is in the slow process corner. In an example, the driver circuit 118 is structured to meet the performance requirement at the maximum limit of the resistance range for the on-die reference resistor 130 (e.g., Rslow). This ensures that the drive strength does not fall below the performance requirement even if the on-die reference resistor 130 is in the slow process corner. Further, the driver circuit 118 is structured to allow $R_{PU}$ and $R_{PD}$ to be higher than the minimum limit of the on-die reference resistor 130 (e.g., Rfast). Since the driver circuit 118 already meets the performance requirement at the Rslow equivalent drive strength, any drive strength stronger than Rslow will also meet the performance requirement. The driver circuit 118 does not need the Rfast equivalent drive strength to meet the performance requirement. One or more driver segment circuits 304 are enabled based on the IO standard requirement. The segmented drivers can be considered as "coarse" drive strength tuning. The pull-up and pull-down circuits in each driver segment provide for "fine" drive strength tuning. The pull-up and pull-down impedances are designed to be higher than Rfast, but lower than Rslow. Therefore, the pull-up and/or pull-down codes will be saturated if the reference resistance is at Rfast. In the Rfast corner, the drive strength is limited by the pull-up and pull-down impedances.

The maximum $R_{PU}$ and $R_{PD}$ impedances of the driver segment circuits 304 may be different due to process variation. For example, the maximum $R_{PU}$ value is lower than the maximum $R_{PD}$ value if the p-channel transistors are in the fast process corner and the n-channel transistors are in the slow process corner. In another example, the maximum $R_{PD}$ value is lower than the maximum $R_{PU}$ value if the n-channel transistors are in the fast process corner and the p-channel transistors are in the slow process corner. This can lead to $R_{PU}$ and $R_{PD}$ impedance mismatch without compensation. As described below, the DCI calibration circuit 120 can compensate for potential $R_{PU}$ and $R_{PD}$ mismatch during calibration.

Figure 4:
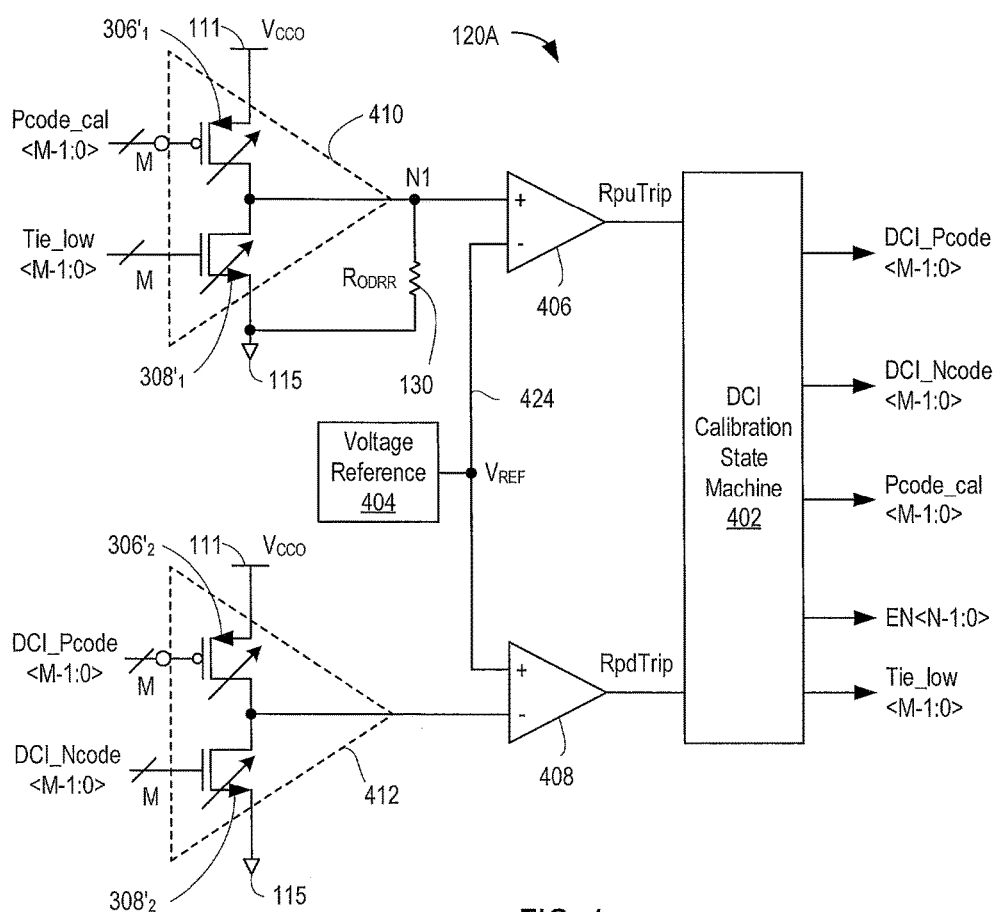
FIG. 4 is a block diagram depicting a circuit implementation of a digitally controlled impedance (DCI) calibration circuit according to an example.

FIG. 4 is a block diagram depicting a circuit implementation 120A of the DCI calibration circuit 120 according to an example. In the circuit implementation 120A, the DCI calibration circuit 120 includes a DCI calibration state machine 402, a voltage reference circuit ("voltage reference 404"), a voltage comparator circuit ("voltage comparator 406"), a voltage comparator 408, a reference driver circuit ("reference driver 410"), a reference driver 412, and the on-die reference resistor 130. In an example, each reference driver 410 and 412 is structured identical to the driver circuit 118, but only having one enabled driver segment circuit 304 (the other driver segment circuits are omitted for clarity). Thus, the reference driver 410 includes M p-channel transistors forming a PU circuit $306'_1$ and M n-channel transistors forming a PD circuit $308'_1$. The reference driver 412 includes M p-channel transistors forming a PU circuit $306'_2$ and M n-channel transistors forming a PU circuit $308'_2$. The PU circuits $306'_1$ and $306'_2$, and the PD circuits $308'_1$ and $308'_2$, are shown schematically as variable transistors having an M-bit gate input. The actual structures of these circuits are shown by $306_{i,1} \ldots 306_{i,M}$ and $308_{i,1} \ldots 308_{i,M}$ in the example of FIG. 3B.

Sources of the PU circuit $306'_1$ are coupled to the supply node 111 to receive the supply voltage $V_{CCO}$. Sources of the PD circuit $308'_1$ are coupled to the ground node 115. Drains of the PU circuit $306'_1$, and drains of the PD circuit $306'_2$, are coupled to the node N1. The on-die reference resistor 130 is coupled between the node N1 and the ground node 115. A non-inverting input of the voltage comparator 406 is coupled to the node N1. An output 424 of the voltage reference 404, which provides a voltage $V_{REF}$, is coupled to an inverting input of the voltage comparator 406. An output of the voltage comparator 406, which provides a digital logic signal RpuTrip, is coupled to an input of the DCI calibration state machine 402. Gates of the PU circuit $306'_1$ receive logical inversions of respective bits of a Pcode_cal<M−1:0> signal. Gates of the PD circuit $308'_1$ receive respective bits of a Tie_low<M−1:0> signal (e.g., all bits set to logic-low). The DCI calibration circuit 120 can include switches, multiplexers, and/or the like (not shown) that couple or selectively couple the Pcode_cal and Tie_low signals to the reference driver 410.

Sources of the PU circuit $306'_2$ are coupled to the supply node 111 to receive the supply voltage $V_{CCO}$. Sources of the PD circuit $308'_2$ are coupled to the ground node 115. Drains of the PU circuit $306'_2$, and drains of the PD circuit $306'_2$, are coupled to an inverting input of the voltage comparator 408. A non-inverting input of the voltage comparator 408 is coupled to the output 424 of the voltage reference 404. An output of the voltage comparator 408, which provides a digital logic signal RpdTrip, is coupled to an input of the DCI calibration state machine 402. Gates of the PU circuit $306'_2$ receive logical inversions of respective bits of the DCI_Pcode<M−1:0> signal. Gates of the PD circuit $308'_2$ receive respective bits of the DCI_Ncode<M–1:0> signal. The DCI calibration circuit 120 can include switches, multiplexers, and/or the like (not shown) that couple or selectively couple the DCI_Pcode and DCI_Ncode signals to the reference driver 412.

The DCI calibration state machine 402 includes an output that supplies the DCI_Pcode<M–1:0> signal, an output that supplies the DCI_Ncode<M–1:0> signal, an output that supplies the Pcode_cal<M–1:0> signal, and an output that supplies the EN<N–1:0> signal. The DCI calibration state machine 402 can include an output that supplies the Tie_low<M–1:0> signal. Operation of the state machine 402 can be understood with reference to the methods shown in FIGS. 5-7, which are described below.

Figure 5:
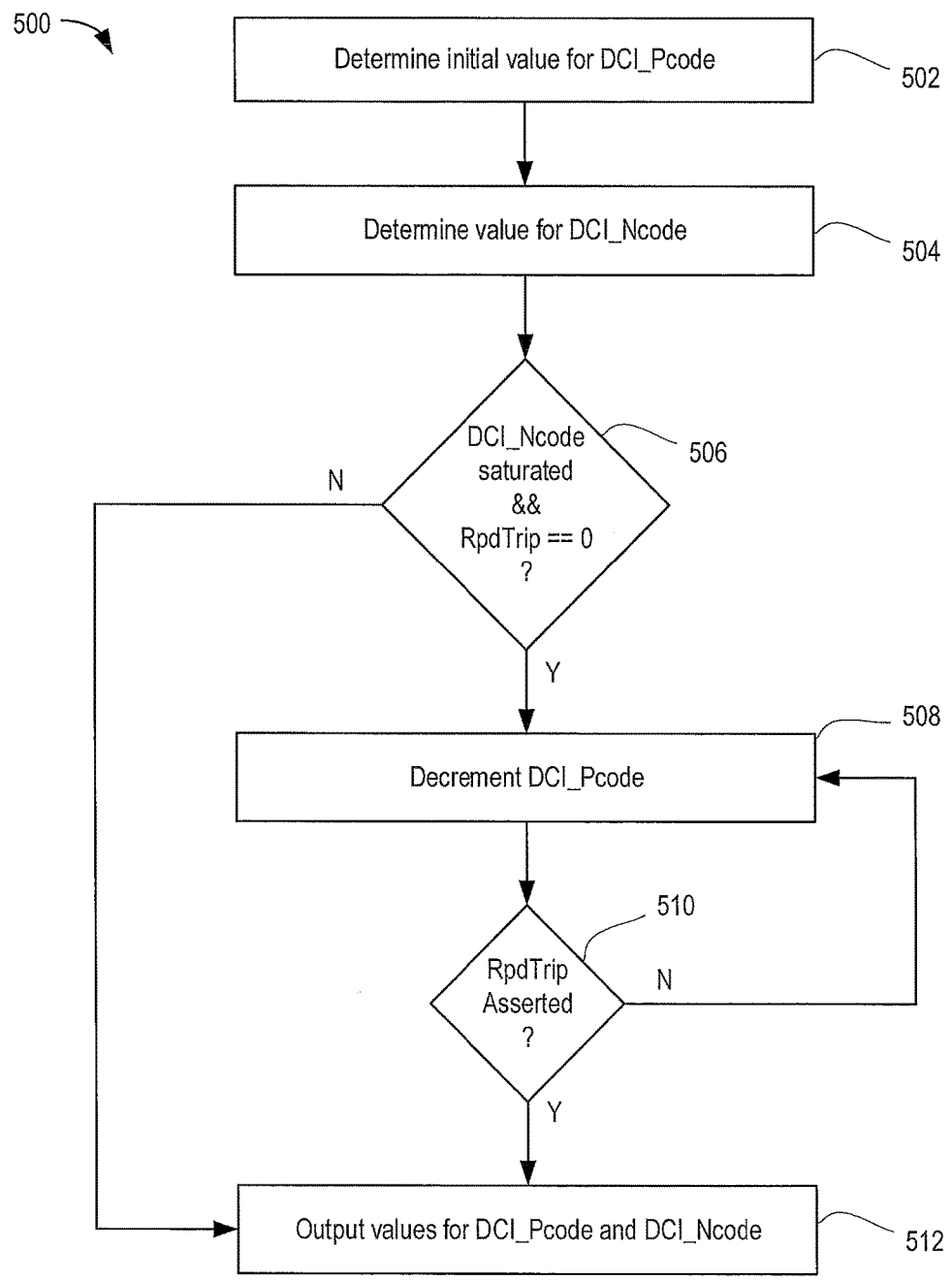
FIG. 5 is a flow diagram depicting a method of calibrating driver output impedance according to an example.

FIG. 5 is a flow diagram depicting a method 500 of calibrating driver output impedance according to an example. The method 500 is performed by the DCI calibration circuit 120, under control of the DCI calibration state machine 402, to calibrate $R_{PU}$ and $R_{PD}$ values in the driver segment circuits 304 of the driver circuit 118 against the resistance $R_{ODRR}$ of the on-die reference resistor 130. The method 500 compensates for potential $R_{PU}$ and $R_{PD}$ mismatch due to the power- and space-saving design of the driver circuit 118, which provides minimum limits of $R_{PU}$ and $R_{PD}$ that are higher than the minimum value of the on-die reference resistor 130. The DCI calibration circuit 120 in the implementation 120A operates first to calibrate $R_{PU}$ against $R_{ODRR}$, then to calibrate $R_{PD}$ against $R_{PU}$, and then to adjust $R_{PU}$ if necessary to correct $R_{PU}$ and $R_{PD}$ mismatch.

Figure 6:
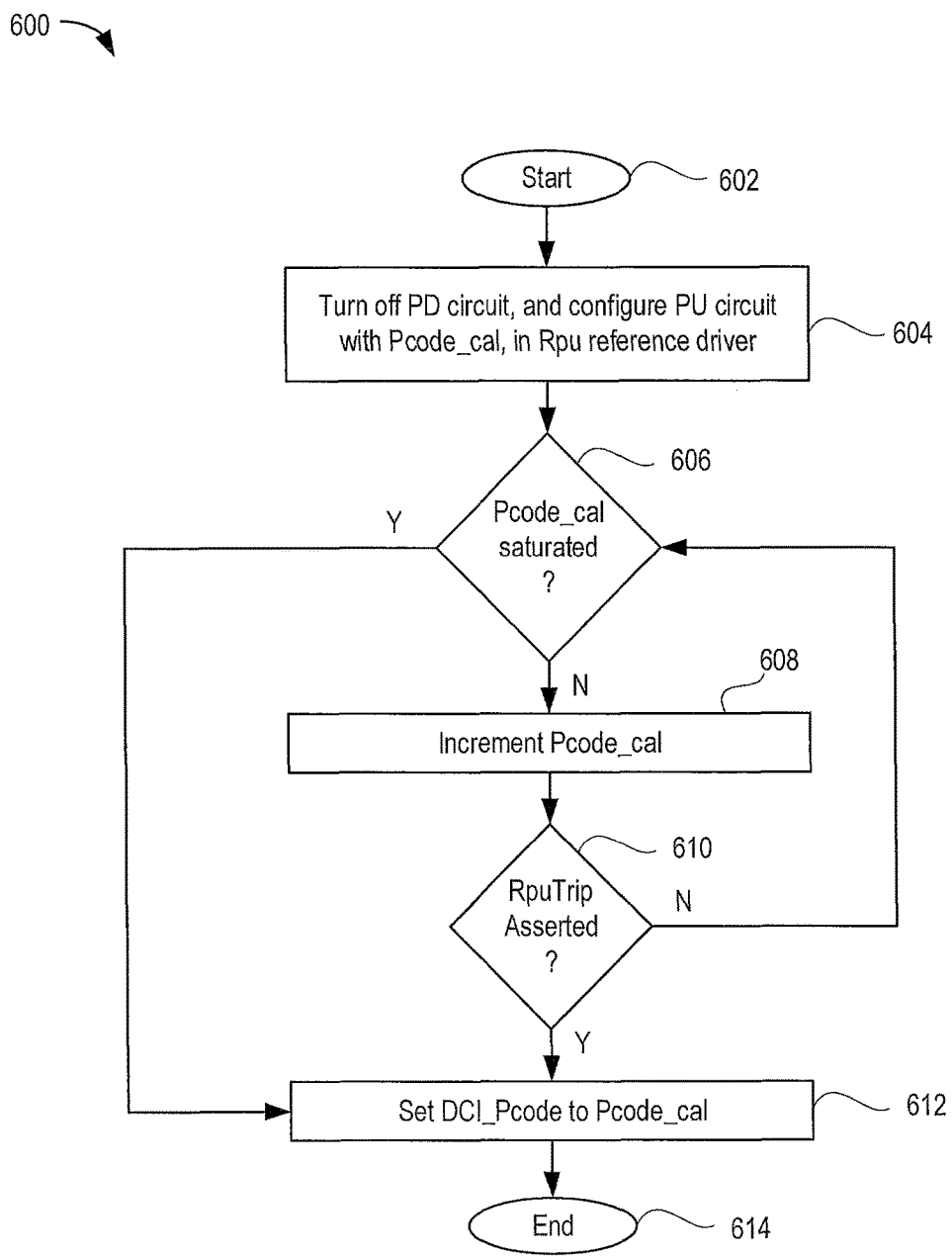
FIG. 6 is a flow diagram depicting a method of determining an initial value for a DCI code according to an example.

The method 500 begins at step 502, where the DCI calibration circuit 120 determines an initial value for the DCI_Pcode. FIG. 6 is a flow diagram depicting a method 600 of determining an initial value for the DCI_Pcode according to an example, which can be performed at step 502. The method 600 begins at step 602. At step 604, the DCI calibration circuit 120 supplies the Pcode_cal and Tie_low signals to the reference driver 410 ($R_{PU}$ reference driver) to turn off the n-channel transistors in the PD circuit 308'$_1$ and selectively turn on p-channel transistors in the PU circuit 306'$_1$. The DCI calibration state machine 402 initializes the value of Pcode_cal to zero (i.e., $R_{PU}$ is high-z).

At step 606, the DCI calibration state machine 402 determines if the Pcode_cal signal is saturated (i.e., has reached its maximum value of $2^M-1$). If not, the method 600 proceeds to step 608 and increments the Pcode_cal by one. This decreases $R_{PU}$ of the reference driver 410 by one step. If the Pcode_cal signal is saturated at step 606, the method 600 proceeds to step 612, where the DCI calibration state machine 402 sets the DCI_Pcode value to the value of Pcode_cal (i.e., the maximum value of $2^M-1$ in this case).

The method 600 proceeds from step 608 to step 610, where the DCI calibration state machine 402 determines if the RpuTrip signal is asserted. The Pcode_cal signal selectively turns on the p-channel transistors of the PU circuit 306'$_1$ according to its current value. The p-channel transistors in the PU circuit 306'$_1$ are structured with binary-weighted output impedances, as described above. A Pcode_cal value of one results in the largest $R_{PU}$ of the reference driver 410, whereas a Pcode_cal value of $2^M-1$ results in the smallest $R_{PU}$ of the reference driver 410. The voltage reference 404 sets $V_{REF}$ to $V_{CCO}/2$. The voltage comparator 406 compares the voltage at node N1 with the reference voltage $V_{REF}$. If the output impedance $R_{PU}$ of the reference driver 410 is greater than $R_{ODRR}$, then the voltage at node N1 is less than $V_{REF}$. In such case, the voltage comparator 406 does not assert the RpuTrip signal (i.e., sets RpuTrip to logic-low). When the output impedance $R_{PU}$ of the reference driver 410 is less than or equal to $R_{ODRR}$, the voltage at node N1 is greater than or equal to $V_{REF}$. In such case, the voltage comparator 406 asserts the RpuTrip signal (i.e., sets RpuTrip to logic-high). If at step 610 the RpuTrip signal is not asserted, the method 600 returns to step 606 and repeats. Otherwise, if the RpuTrip signal is asserted, the method 600 proceeds to step 612, and sets the DCI_Pcode to Pcode_cal. The method 600 ends at step 614. In this manner, the DCI calibration circuit 120 determines an initial value of DCI_Pcode that is either the maximum value (i.e., DCI_Pcode is saturated) or results in $R_{PU}$ being equal to or approximately equal to $R_{ODRR}$.

Figure 7:
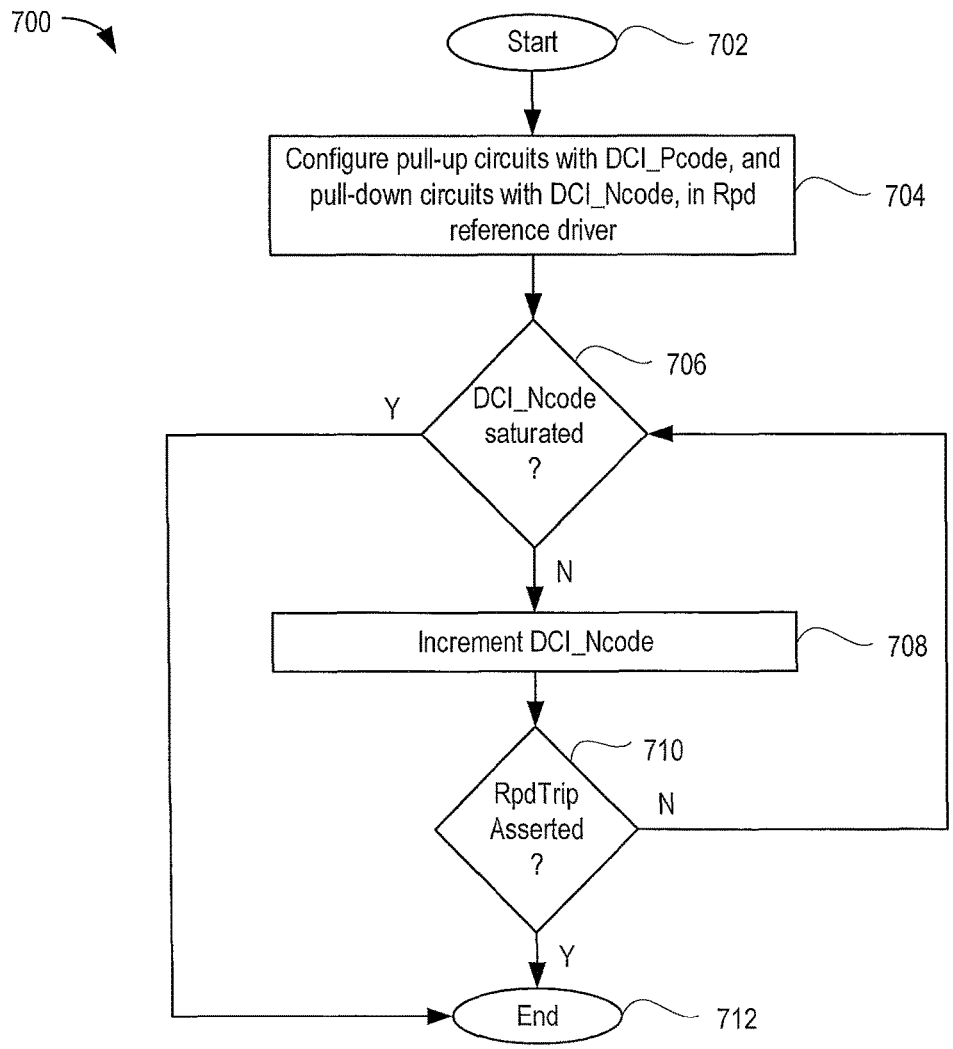
FIG. 7 is a flow diagram depicting a method of determining a value for a DCI code according to an example.

Returning to FIG. 5, the method 500 proceeds from step 502 to step 504. At step 504, the DCI calibration circuit 120 determines a value for DCI_Ncode. FIG. 7 is a flow diagram depicting a method 700 of determining a value for the DCI_Ncode according to an example, which can be performed at step 504. The method 700 begins at step 702. At step 704, the DCI calibration circuit 120 supplies the DCI_Pcode and DCI_Ncode signals to the reference driver 412 ($R_{PD}$ reference driver) to selectively turn on p-channel transistors in the PU circuit 306'$_2$ and to selectively turn on the n-channel transistors in the PD circuit 308'$_2$. The DCI calibration state machine 402 initialized the value of DCI_Pcode in the step 502 above. The DCI calibration state machine 402 initializes the value of DCI_Ncode to zero (i.e., $R_{PD}$ is high-z).

At step 706, the DCI calibration state machine 402 determines if the DCI_Ncode signal is saturated (i.e., has reached its maximum value of $2^M-1$). If not, the method 700 proceeds to step 708 and increments the DCI_Ncode by one. This decreases $R_{PD}$ of the reference driver 412 by one step. If the DCI_Ncode signal is saturated at step 706, the method 700 proceeds to step 712 and ends.

The DCI_Ncode signal selectively turns on the n-channel transistors of the PD circuit 308'$_2$ according to its current value. The n-channel transistors in the PD circuit 308'$_2$ are structured with binary-weighted output impedances, as described above. A DCI_Ncode value of one results in the largest $R_{PD}$ of the reference driver 412, whereas a DCI_Ncode value of $2^M-1$ results in the smallest $R_{PD}$ of the reference driver 412. The voltage reference 404 sets $V_{REF}$ to $V_{CCO}/2$. The voltage comparator 408 compares the output voltage of the reference driver 412 with the reference voltage $V_{REF}$. If $R_{PD}$ is greater than $R_{PU}$ in the reference driver 412, then the output voltage of the reference driver 412 is greater than $V_{REF}$. In such case, the voltage comparator 408 does not assert the RpdTrip signal (i.e., sets RpdTrip to logic-low). When the impedance $R_{PD}$ is less than or equal to $R_{PU}$ in the reference driver 412, the output voltage of the reference driver 412 is less than or equal to $V_{REF}$. In such case, the voltage comparator 408 asserts the RpdTrip signal (i.e., sets RpdTrip to logic-high). If at step 710 the RpdTrip signal is not asserted, the method 700 returns to step 706 and repeats. Otherwise, if the RpdTrip signal is asserted, the method 700 proceeds to step 712 and ends. In this manner, the DCI calibration circuit 120 determines a value of DCI_Ncode that is either the maximum value (i.e., DCI_Ncode is saturated) or results in $R_{PD}$ being equal to or approximately equal to $R_{ODRR}$.

Returning to FIG. 5, the DCI calibration state machine 402 determines, at step 506, whether the DCI_Ncode is saturated and the RpdTrip signal is not asserted. If this is the case, the method 500 proceeds to step 508. If the DCI_Ncode is not saturated or if the RpdTrip signal has been asserted, then the method 500 proceeds to step 512, where the DCI calibration state machine 402 outputs the values for DCI_Pcode and DCI_Ncode.

The method 500 arrives at step 508 when the $R_{PD}$ in the reference driver 412 cannot be made less than or equal to $R_{PU}$ in the reference driver 412. Since DCI_Pcode was initialized in step 502 to be equal to or approximately equal to $R_{ODRR}$, the method 500 arrives at step 508 when $R_{PD}$ in the reference driver 412 cannot be made less than or equal to $R_{ODRR}$. For example, the on-die reference resistor 130 may be in the fast process corner. In such case, DCI_Ncode saturates at its maximum value and RpdTrip remains de-asserted.

Figure 8:
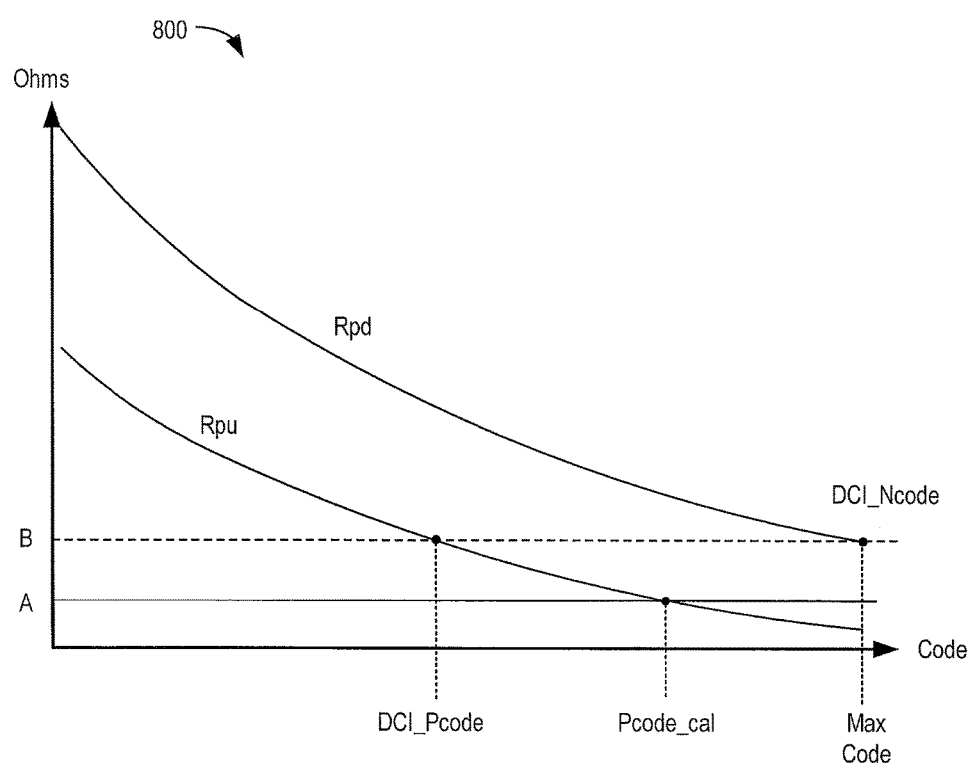
FIG. 8 is a graph depicting output impedance versus code according to an example.

FIG. 8 is a graph 800 depicting $R_{PU}$ and $R_{PD}$ versus code according to an example. The vertical axis of the graph 800 represents resistance in ohms, and the horizontal axis in the graph 800 represents DCI code value (DCI_Ncode for $R_{PD}$ and DCI_Pcode for $R_{PU}$). As shown in the example, the value of DCI_Ncode has saturated at its maximum value (Max Code), resulting in a value of $R_{PD}$ of B. The value of Pcode_cal after calibration at step 502 results in a value of $R_{PU}$ of A. If DCI_Pcode is not adjusted after being set to Pcode_cal, then there is an impedance mismatch between $R_{PU}$ and $R_{PD}$ (i.e., the difference between A and B). Such a mismatch, if left uncorrected, will affect operation of the driver circuit 118, such as causing duty cycle distortion (DCD) in the transmitted signal.

Returning to FIG. 5, at step 508, the DCI calibration state machine 402 decrements the DCI_Pcode by one (i.e., increases the value of $R_{PU}$ by one unit). At step 510, the DCI calibration state machine 402 determines if the RpdTrip signal has been asserted. If not, the method 500 returns to step 508 and repeats. Otherwise, the method 500 proceeds from step 510 to step 512. In this manner, the DCI_Pcode value is reduced, thereby reducing the value of $R_{PU}$ until $R_{PU}$ is less than or equal to $R_{PD}$. When $R_{PU}$ becomes less than or equal to $R_{PD}$, the output voltage of the reference driver 412 will become less than $V_{REF}$, causing the voltage comparator 408 to assert the RpdTrip signal. This is illustrated in FIG. 8, where the value of DCI_Pcode is reduced from Pcode_cal, which results in $R_{PU}$ having a resistance B equal to or approximately equal to that of $R_{PD}$.

Figure 9:
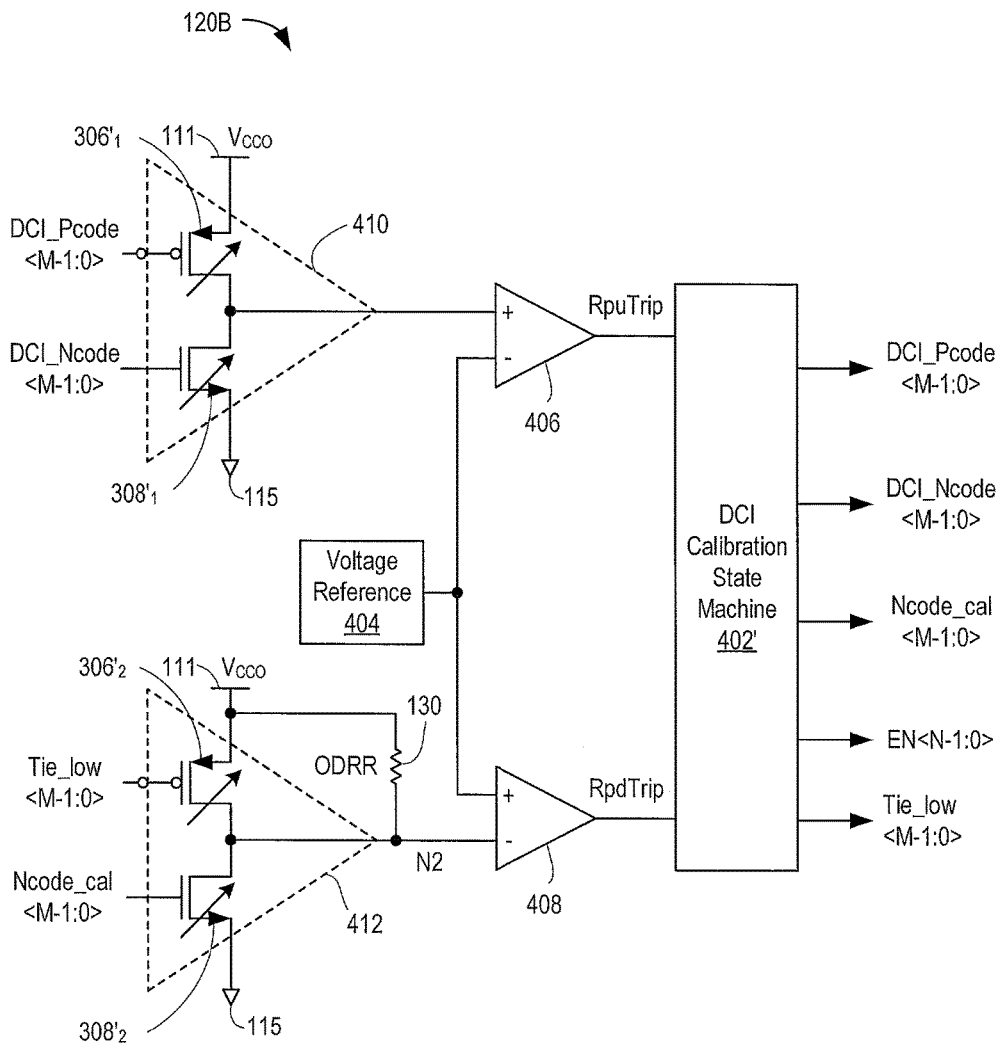
FIG. 9 is a block diagram depicting a circuit implementation of a DCI calibration circuit according to another example.

FIG. 9 is a block diagram depicting a circuit implementation 120B of the DCI calibration circuit 120 according to an example. The circuit implementation 120B is similar to the circuit implementation 120A, except that the on-die reference resistor 130 is coupled between a node N2 and the supply node 111. The node N2 is formed by the output of the reference driver 412 and the non-inverting input of the voltage comparator 408. Another difference is that a DCI calibration state machine 402' generates an Ncode_cal<M−1:0> in place of the Pcode_cal<M−1:0>. Further, the DCI calibration state machine 402' supplies the Ncode_cal signal to the gates of the PD circuit 308'$_2$, and supplies the Tie_low signal to the gates of the PU circuit 306'$_2$. Further, the DCI calibration state machine 402' supplies the DCI_Pcode and DCI_Ncode signals to the gates of the PU circuit 306'$_1$ and the PD circuit 306'$_1$, respectively. The DCI calibration circuit 120 in the implementation 120B operates first to calibrate $R_{PD}$ against $R_{ODRR}$, then to calibrate $R_{PU}$ against $R_{PD}$, and then to adjust $R_{PD}$ if necessary to correct $R_{PU}$ and $R_{PD}$ mismatch.

Figure 10:
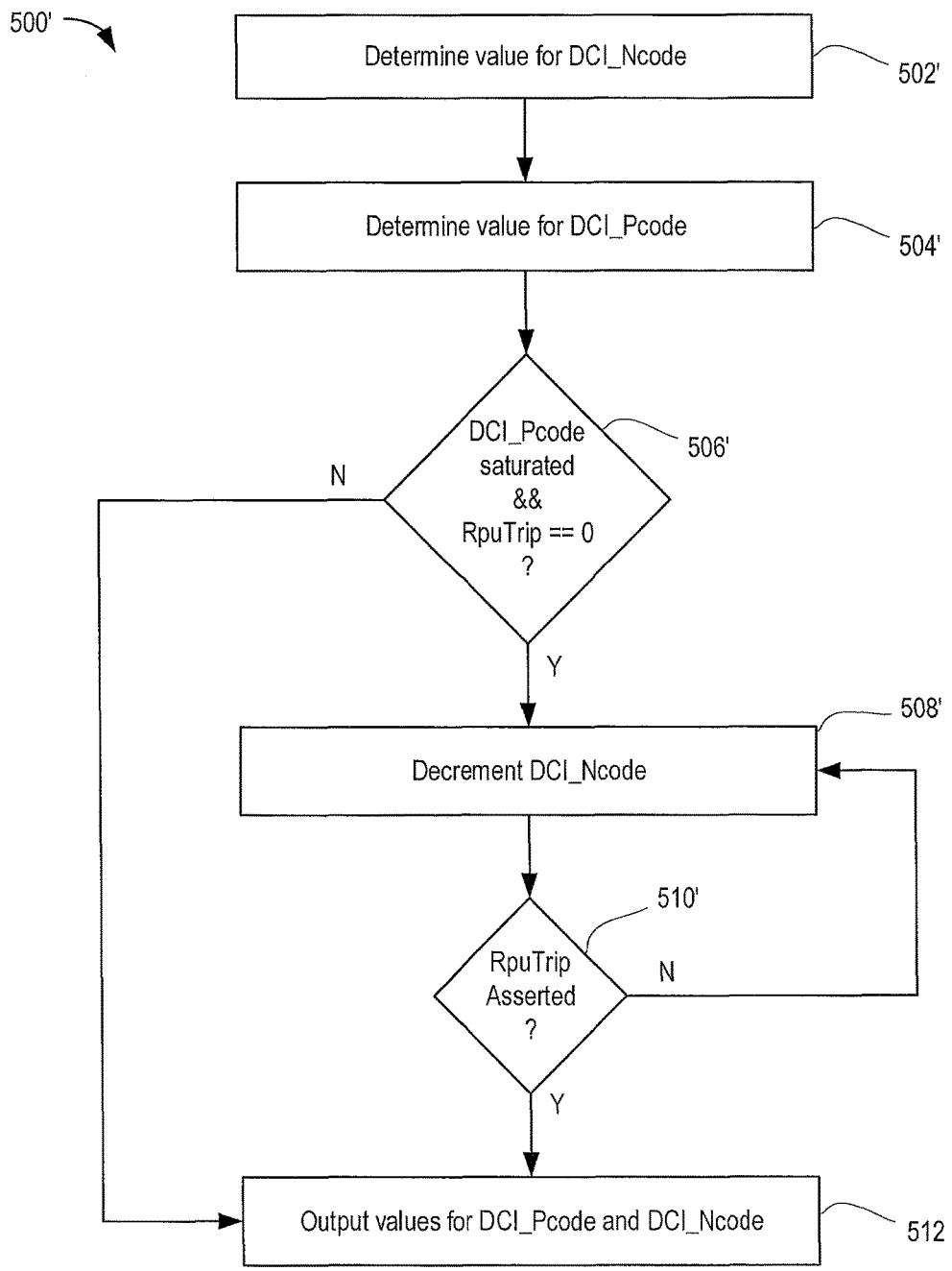
FIG. 10 is a flow diagram depicting a method of calibrating driver output impedance according to another example.

FIG. 10 is a flow diagram depicting a method 500' of calibrating driver output impedance according to an example. The method 500' is performed by the DCI calibration circuit 120, under control of the DCI calibration state machine 402', to calibrate $R_{PU}$ and $R_{PD}$ values in the driver segment circuits 304 of the driver circuit 118 against the resistance $R_{ODRR}$ of the on-die reference resistor 130. The method 500' compensates for potential $R_{PU}$ and $R_{PD}$ mismatch due to the power- and space-saving design of the driver circuit 118, which provides minimum limits of $R_{PU}$ and $R_{PD}$ that are higher than the minimum value of the on-die reference resistor 130.

Figure 11:
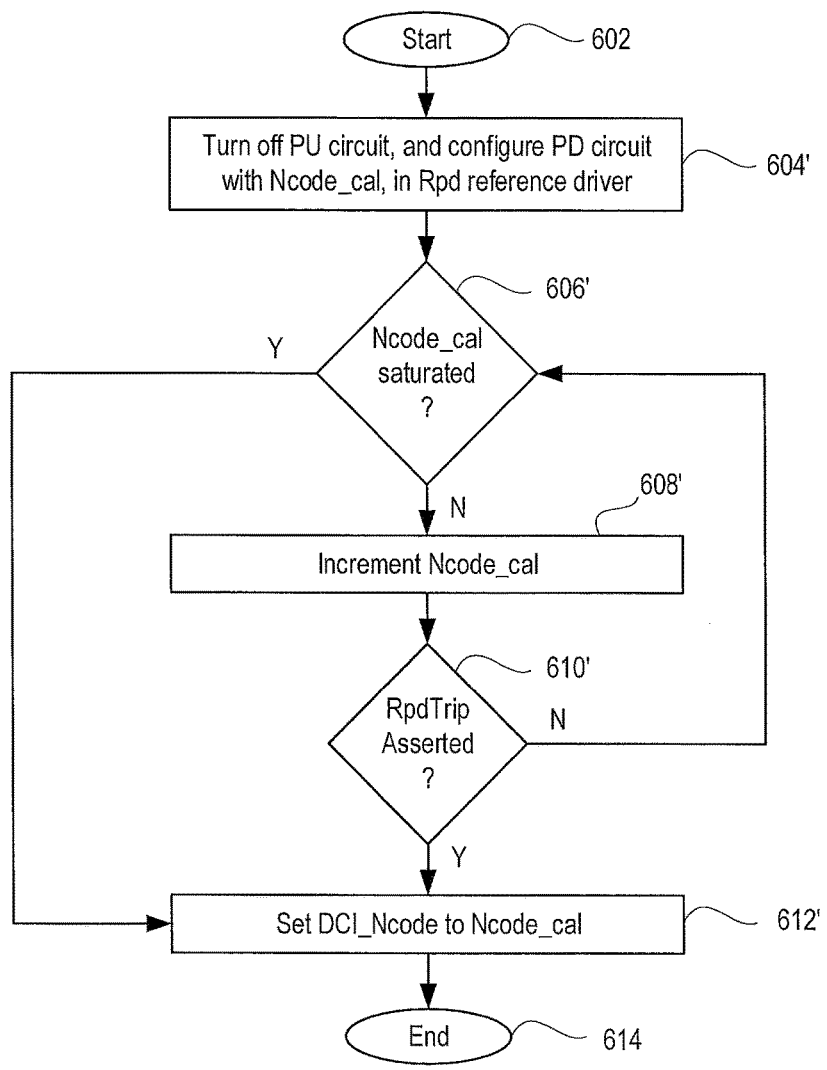
FIG. 11 is a flow diagram depicting a method of determining an initial value for a DCI code according to an example.

The method 500' begins at step 502', where the DCI calibration circuit 120 determines an initial value for the DCI_Ncode. FIG. 11 is a flow diagram depicting a method 600' of determining an initial value for the DCI_Ncode according to an example, which can be performed at step 502'. The method 600' begins at step 602. At step 604', the DCI calibration circuit 120 supplies the Ncode_cal and Tie_low signals to the reference driver 412 ($R_{PD}$ reference driver) to turn off the p-channel transistors in the PU circuit 306'$_2$ and selectively turn on n-channel transistors in the PD circuit 308'$_2$. The DCI calibration state machine 402' initializes the value of Ncode_cal to zero (i.e., $R_{PD}$ is high-z).

At step 606', the DCI calibration state machine 402' determines if the Ncode_cal signal is saturated (i.e., has reached its maximum value of $2^M-1$). If not, the method 600' proceeds to step 608' and increments the Ncode_cal by one. This decreases $R_{PD}$ of the reference driver 412 by one step. If the Ncode_cal signal is saturated at step 606', the method 600' proceeds to step 612', where the DCI calibration state machine 402' sets the DCI_Ncode value to the value of Ncode_cal (i.e., the maximum value of $2^M-1$ in this case).

The method 600' proceeds from step 608' to step 610', where the DCI calibration state machine 402' determines if the RpdTrip signal is asserted. The Ncode_cal signal selectively turns on the n-channel transistors of the PD circuit 308'$_2$ according to its current value. The n-channel transistors in the PD circuit 308'$_2$ are structured with binary-weighted output impedances, as described above. An Ncode_cal value of one results in the largest $R_{PD}$ of the reference driver 412, whereas an Ncode_cal value of $2^M-1$ results in the smallest $R_{PD}$ of the reference driver 412. The voltage reference 404 sets $V_{REF}$ to $V_{CCO}/2$. The voltage comparator 408 compares the voltage at node N2 with the reference voltage $V_{REF}$. If the output impedance $R_{PD}$ of the reference driver 412 is greater than $R_{ODRR}$, then the voltage at node N2 is greater than $V_{REF}$. In such case, the voltage comparator 408 does not assert the RpdTrip signal (i.e., sets RpdTrip to logic-low). When the output impedance $R_{PD}$ of the reference driver 412 is less than or equal to $R_{ODRR}$, the voltage at node N2 is less than or equal to $V_{REF}$. In such case, the voltage comparator 408 asserts the RpdTrip signal (i.e., sets RpdTrip to logic-high). If at step 610' the RpdTrip signal is not asserted, the method 600' returns to step 606' and repeats. Otherwise, if the RpdTrip signal is asserted, the method 600' proceeds to step 612', and sets the DCI_Ncode to Ncode_cal. The method 600' ends at step 614. In this manner, the DCI calibration circuit 120 determines an initial value of DCI_Ncode that is either the maximum value (i.e., DCI_Ncode is saturated) or results in $R_{PD}$ being equal to or approximately equal to $R_{ODRR}$.

Figure 12:
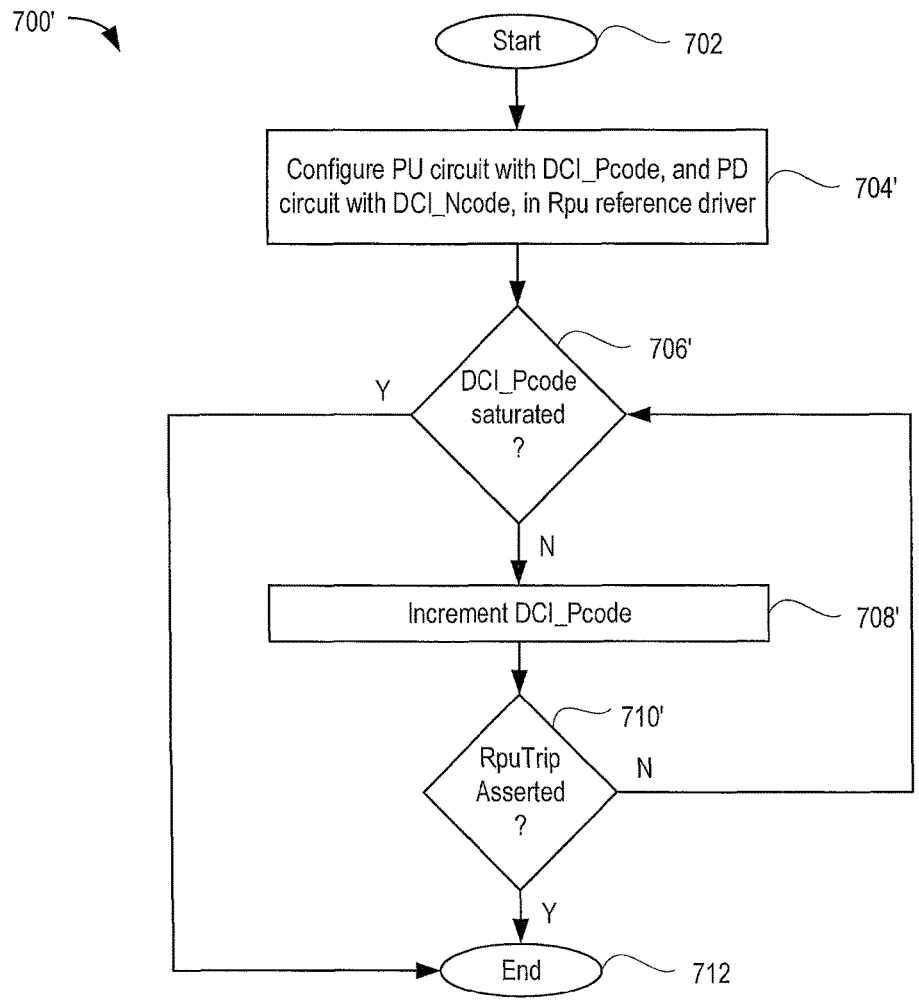
FIG. 12 is a flow diagram depicting a method of determining a value for a DCI code according to an example.

Returning to FIG. 10, the method 500' proceeds from step 502' to step 504'. At step 504', the DCI calibration circuit 120 determines a value for DCI_Pcode. FIG. 12 is a flow diagram depicting a method 700' of determining a value for the DCI_Pcode according to an example, which can be performed at step 504'. The method 700' begins at step 702. At step 704', the DCI calibration circuit 120 supplies the DCI_Ncode and DCI_Pcode signals to the reference driver 410 ($R_{PU}$ reference driver) to selectively turn on p-channel transistors in the PU circuit 306'$_1$ and to selectively turn on the n-channel transistors in the PD circuit 308'$_1$. The DCI calibration state machine 402' initialized the value of DCI_Ncode in the step 502' above. The DCI calibration state machine 402' initializes the value of DCI_Pcode to zero (i.e., $R_{PU}$ is high-z).

At step 706', the DCI calibration state machine 402' determines if the DCI_Pcode signal is saturated (i.e., has reached its maximum value of $2^M-1$). If not, the method 700' proceeds to step 708' and increments the DCI_Pcode by one. This decreases $R_{PU}$ of the reference driver 410 by one step. If the DCI_Pcode signal is saturated at step 706', the method 700' proceeds to step 712 and ends.

The DCI_Pcode signal selectively turns on the p-channel transistors of the PU circuit 306'$_1$ according to its current value. The p-channel transistors in the PU circuit 306'$_1$ are structured with binary-weighted output impedances, as described above. A DCI_Pcode value of one results in the largest $R_{PU}$ of the reference driver 410, whereas a DCI_Pcode value of $2^M-1$ results in the smallest $R_{PU}$ of the reference driver 410. The voltage reference 404 sets $V_{REF}$ to $V_{CCO}/2$. The voltage comparator 406 compares the output voltage of the reference driver 410 with the reference voltage $V_{REF}$. If $R_{PU}$ is greater than $R_{PD}$ in the reference driver 410, then the output voltage of the reference driver 410 is less than $V_{REF}$. In such case, the voltage comparator 406 does not assert the RpuTrip signal (i.e., sets RpuTrip to logic-low). When the impedance $R_{PU}$ is less than or equal to $R_{PD}$ in the reference driver 410, the output voltage of the reference driver 410 is greater than or equal to $V_{REF}$. In such case, the voltage comparator 406 asserts the RpuTrip signal (i.e., sets RpuTrip to logic-high). If at step 710' the RpuTrip signal is not asserted, the method 700' returns to step 706' and repeats. Otherwise, if the RpuTrip signal is asserted, the method 700' proceeds to step 712 and ends. In this manner, the DCI calibration circuit 120 determines a value of DCI_Pcode that is either the maximum value (i.e., DCI_Pcode is saturated) or results in $R_{PU}$ being equal to or approximately equal to $R_{ODRR}$.

Returning to FIG. 10, the DCI calibration state machine 402' determines, at step 506', whether the DCI_Pcode is saturated and the RpuTrip signal is not asserted. If this is the case, the method 500' proceeds to step 508'. If the DCI_Pcode is not saturated or if the RpuTrip signal has been asserted, then the method 500' proceeds to step 512, where the DCI calibration state machine 402' outputs the values for DCI_Pcode and DCI_Ncode.

The method 500' arrives at step 508' when the $R_{PU}$ in the reference driver 410 cannot be made less than or equal to $R_{PD}$ in the reference driver 410. Since DCI_Ncode was initialized in step 502' to be equal to or approximately equal to $R_{ODRR}$, the method 500' arrives at step 508' when $R_{PU}$ in the reference driver 410 cannot be made less than or equal to $R_{ODRR}$. For example, the on-die reference resistor 130 may be in the fast process corner. In such case, DCI_Pcode saturates at its maximum value and RpuTrip remains de-asserted.

At step 508', the DCI calibration state machine 402' decrements the DCI_Ncode by one (i.e., increases the value of $R_{PD}$ by one unit). At step 510', the DCI calibration state machine 402' determines if the RpuTrip signal has been asserted. If not, the method 500' returns to step 508' and repeats. Otherwise, the method 500' proceeds from step 510' to step 512'. In this manner, the DCI_Ncode value is reduced, thereby reducing the value of $R_{PD}$ until $R_{PD}$ is less than or equal to $R_{PU}$. When $R_{PD}$ becomes less than or equal to $R_{PU}$, the output voltage of the reference driver 410 will become greater than $V_{REF}$, causing the voltage comparator 406 to assert the RpuTrip signal.

Figure 13:
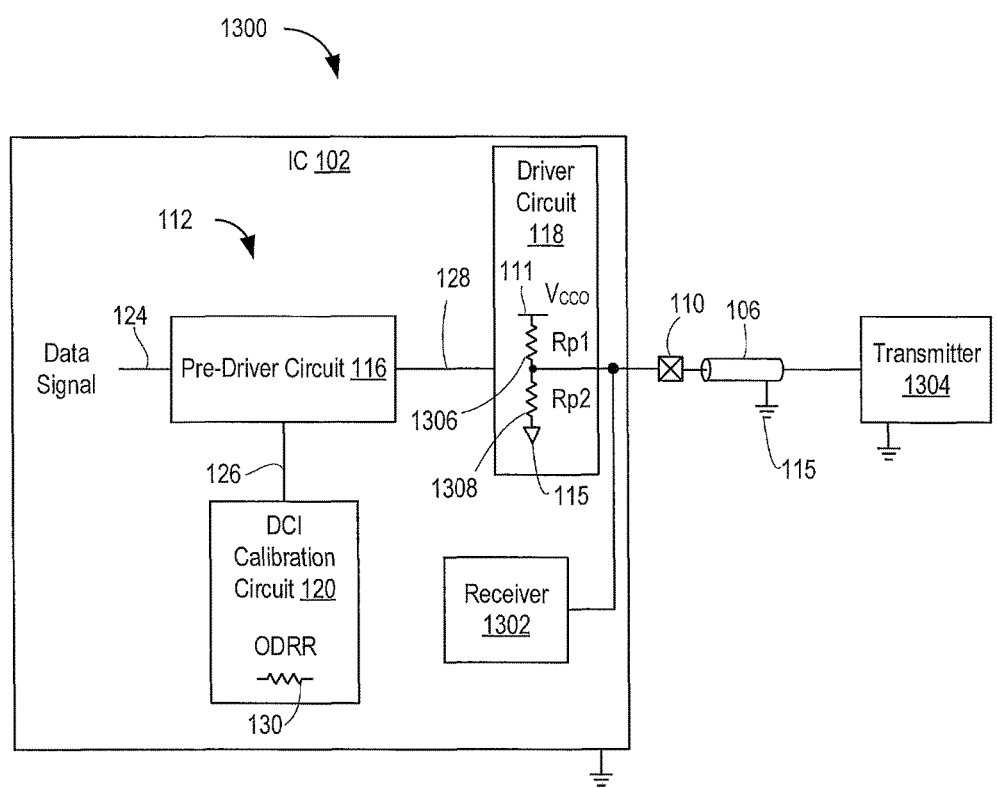
FIG. 13 is a block diagram depicting a communication system according to another example.

FIG. 13 is a block diagram depicting a serial communication system 1300 according to an example. Elements of FIG. 13 that are the same or similar to those of FIG. 1 are described in detail above. In the present example, the receiver 104 is replaced with a transmitter 1304, and the IC 102 includes a receiver 1302 coupled to the pad 110. In such case, the pre-driver circuit 116 can receive an ODT signal (shown in FIG. 3A) that configures driver circuit 118 to provide an ODT for the receiver 1302. The ODT in the example includes an impedance 1306 having a value Rp1 coupled between the supply node 111 and the pad 110 and an impedance 1308 having a value Rp2 coupled between the pad 110 and the ground node 115. As shown in the table 320 in FIG. 3C, if the ODT signal is asserted, the Data goes to high-impedance. If the enable signal EN<i> is asserted, Pcode$_i$ is set to DCI_Pcode and Ncode$_i$ is set to DCI_Ncode. The DCI calibration circuit 120 calibrates the driver circuit 118 as described in the examples above.

Figure 14:
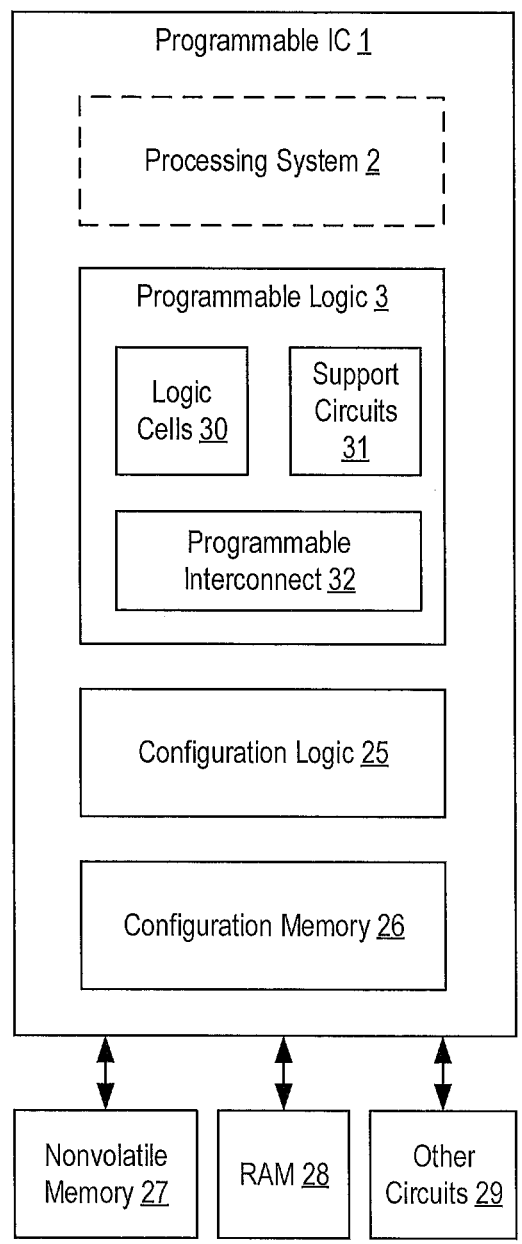
FIG. 14 is a block diagram depicting a programmable integrated circuit (IC) according to an example in which a transmitter described herein can be used.

FIG. 14 is a block diagram depicting a programmable IC 1 according to an example in which the transmitter 112 described herein can be used. The programmable IC 1 includes programmable logic 3, configuration logic 25, and configuration memory 26. The programmable IC 1 can be coupled to external circuits, such as nonvolatile memory 27, DRAM 28, and other circuits 29. The programmable logic 3 includes logic cells 30, support circuits 31, and programmable interconnect 32. The logic cells 30 include circuits that can be configured to implement general logic functions of a plurality of inputs. The support circuits 31 include dedicated circuits, such as transceivers, input/output blocks, digital signal processors, memories, and the like. The logic cells and the support circuits 31 can be interconnected using the programmable interconnect 32. Information for programming the logic cells 30, for setting parameters of the support circuits 31, and for programming the programmable interconnect 32 is stored in the configuration memory 26 by the configuration logic 25. The configuration logic 25 can obtain the configuration data from the nonvolatile memory 27 or any other source (e.g., the DRAM 28 or from the other circuits 29). In some examples, the programmable IC 1 includes a processing system 2. The processing system 2 can include microprocessor(s), memory, support circuits, IO circuits, and the like.

Figure 15:
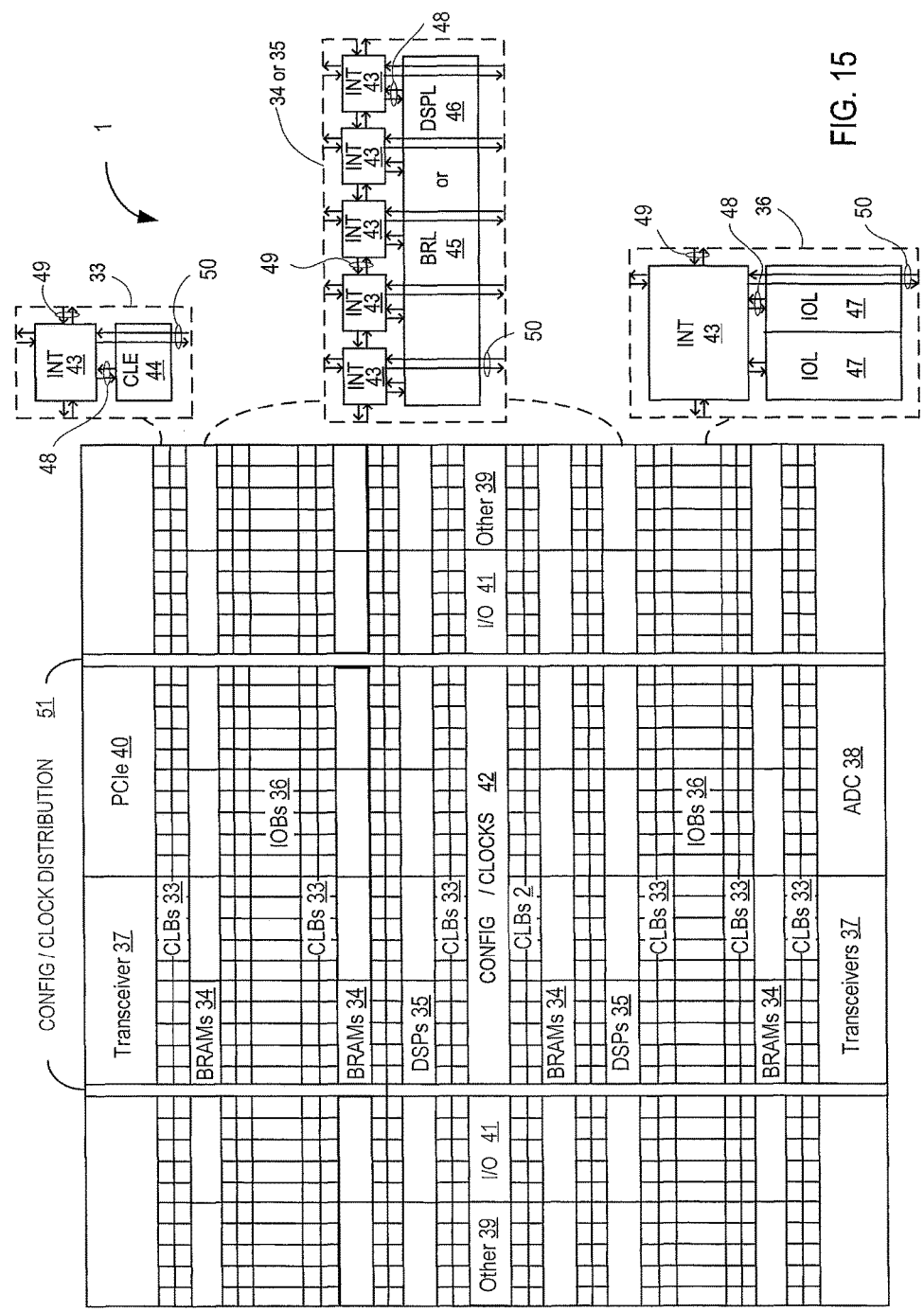
FIG. 15 illustrates a field programmable gate array (FPGA) implementation of the programmable IC of FIG. 14 according to an example.

FIG. 15 illustrates a field programmable gate array (FPGA) implementation of the programmable IC 1 that includes a large number of different programmable tiles including transceivers 37, configurable logic blocks ("CLBs") 33, random access memory blocks ("BRAMs") 34, input/output blocks ("IOBs") 36, configuration and clocking logic ("CONFIG/CLOCKS") 42, digital signal processing blocks ("DSPs") 35, specialized input/output blocks ("I/O") 41 (e.g., configuration ports and clock ports), and other programmable logic 39 such as digital clock managers, analog-to-digital converters, system monitoring logic, and so forth. The FPGA can also include PCIe interfaces 40, analog-to-digital converters (ADC) 38, and the like.

In some FPGAs, each programmable tile can include at least one programmable interconnect element ("INT") 43 having connections to input and output terminals 48 of a programmable logic element within the same tile, as shown by examples included at the top of FIG. 15. Each programmable interconnect element 43 can also include connections to interconnect segments 49 of adjacent programmable interconnect element(s) in the same tile or other tile(s). Each programmable interconnect element 43 can also include connections to interconnect segments 50 of general routing resources between logic blocks (not shown). The general routing resources can include routing channels between logic blocks (not shown) comprising tracks of interconnect segments (e.g., interconnect segments 50) and switch blocks (not shown) for connecting interconnect segments. The interconnect segments of the general routing resources (e.g., interconnect segments 50) can span one or more logic blocks. The programmable interconnect elements 43 taken together with the general routing resources implement a programmable interconnect structure ("programmable interconnect") for the illustrated FPGA.

In an example implementation, a CLB 33 can include a configurable logic element ("CLE") 44 that can be programmed to implement user logic plus a single programmable interconnect element ("INT") 43. A BRAM 34 can include a BRAM logic element ("BRL") 45 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 35 can include a DSP logic element ("DSPL") 46 in addition to an appropriate number of programmable interconnect elements. An IOB 36 can include, for example, two instances of an input/output logic element ("IOL") 47 in addition to one instance of the programmable interconnect element 43. As will be clear to those of skill in the art, the actual I/O pads connected, for example, to the I/O logic element 47 typically are not confined to the area of the input/output logic element 47.

In the pictured example, a horizontal area near the center of the die (shown in FIG. 15) is used for configuration, clock, and other control logic. Vertical columns 51 extending from this horizontal area or column are used to distribute the clocks and configuration signals across the breadth of the FPGA.

Some FPGAs utilizing the architecture illustrated in FIG. 15 include additional logic blocks that disrupt the regular columnar structure making up a large part of the FPGA. The additional logic blocks can be programmable blocks and/or dedicated logic.

Note that FIG. 15 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 15 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. A transmitter, comprising:
   a driver circuit having a pull-up circuit, and a pull-down circuit, coupled to an output pad;
   a digitally controlled impedance (DCI) calibration circuit having a first reference driver, a second reference driver, and a reference resistor, the DCI calibration circuit configured to:
   generate a value for a first code by calibrating a first impedance in the first reference driver against the reference resistor;
   generate a value for a second code by calibrating a second impedance in the second reference driver against the first impedance; and
   adjust the value of the first code to match the first impedance with the second impedance; and
   a pre-driver circuit configured to supply the first code and the second code to the driver circuit for adjusting output impedance of the pull-up circuit and the pull-down circuit.

2. The transmitter of claim 1, wherein the DCI calibration circuit comprises:
   a DCI calibration state machine configured to generate the first code and the second code;
   a voltage reference circuit;
   a first voltage comparator having a non-inverting input coupled to an output of the first reference driver, an inverting input coupled to an output of the voltage reference circuit, and an output coupled to a first input of the DCI calibration state machine; and
   a second voltage comparator having a non-inverting input coupled to the output of the voltage reference circuit, an inverting input coupled to an output of the second reference driver, and an output coupled to a second input of the DCI calibration state machine.

3. The transmitter of claim 2, wherein the reference resistor is coupled between a ground node and a node formed by the output of the first reference driver and the non-inverting input of the first voltage comparator.

4. The transmitter of claim 3, wherein the DCI calibration state machine is further configured to:
   generate a third code and a fourth code;
   supply the third code to a pull-up circuit in the first reference driver;
   supply the fourth code to a pull-down circuit in the first reference driver;
   supply the first code to a pull-up circuit in the second reference driver; and
   supply the second code to a pull-down circuit in the second reference driver.

5. The transmitter of claim 2, wherein the reference resistor is coupled between a supply node and a node formed by the output of the second reference driver and the inverting input of the second voltage comparator.

6. The transmitter of claim 5, wherein the DCI calibration state machine is further configured to:
   generate a third code and a fourth code;
   supply the third code to a pull-down circuit in the second reference driver;
   supply the fourth code to a pull-up circuit in the second reference driver;
   supply the first code to a pull-up circuit in the first reference driver; and
   supply the second code to a pull-down circuit in the first reference driver.

7. The transmitter of claim 1, wherein the pull-up circuit is a first pull-up circuit of a plurality of pull-up circuits in a respective plurality of driver segment circuits of the driver circuit, wherein the pull-down circuit is a first pull-down circuit of a plurality of pull-down circuits in the respective plurality of driver segment circuits, and wherein the pre-driver circuit is configured to supply the first code and the second code to the driver circuit for adjusting output impedance of each of the plurality of pull-up circuits and each of the plurality of pull-down circuits.

8. An integrated circuit (IC), comprising:
   an output pad;
   a reference resistor;
   a driver circuit having a pull-up circuit, and a pull-down circuit, coupled to the output pad;
   a digitally controlled impedance (DCI) calibration circuit having a first reference driver and a second reference driver, the DCI calibration circuit configured to:
      generate a value for a first code by calibrating a first impedance in the first reference driver against the reference resistor;
      generate a value for a second code by calibrating a second impedance in the second reference driver against the first impedance; and
      adjust the value of the first code to match the first impedance with the second impedance; and
   a pre-driver circuit configured to supply the first code and the second code to the driver circuit for adjusting output impedance of the pull-up circuit and the pull-down circuit.

9. The IC of claim 8, wherein the DCI calibration circuit comprises:
   a DCI calibration state machine configured to generate the first code and the second code;
   a voltage reference circuit;
   a first voltage comparator having a non-inverting input coupled to an output of the first reference driver, an inverting input coupled to an output of the voltage reference circuit, and an output coupled to a first input of the DCI calibration state machine; and
   a second voltage comparator having a non-inverting input coupled to the output of the voltage reference circuit, an inverting input coupled to an output of the second reference driver, and an output coupled to a second input of the DCI calibration state machine.

10. The IC of claim 9, wherein the reference resistor is coupled between a ground node and a node formed by the output of the first reference driver and the non-inverting input of the first voltage comparator.

11. The IC of claim 10, wherein the DCI calibration state machine is further configured to:
   generate a third code and a fourth code;
   supply the third code to a pull-up circuit in the first reference driver;
   supply the fourth code to a pull-down circuit in the first reference driver;
   supply the first code to a pull-up circuit in the second reference driver; and
   supply the second code to a pull-down circuit in the second reference driver.

12. The IC of claim 9, wherein the reference resistor is coupled between a supply node and a node formed by the output of the second reference driver and the inverting input of the second voltage comparator.

13. The IC of claim 12, wherein the DCI calibration state machine is further configured to:
   generate a third code and a fourth code;
   supply the third code to a pull-down circuit in the second reference driver;
   supply the fourth code to a pull-up circuit in the second reference driver;
   supply the first code to a pull-up circuit in the first reference driver; and
   supply the second code to a pull-down circuit in the first reference driver.

14. The IC of claim 8, wherein the pull-up circuit is a first pull-up circuit of a plurality of pull-up circuits in a respective plurality of driver segment circuits of the driver circuit, wherein the pull-down circuit is a first pull-down circuit of a plurality of pull-down circuits in the respective plurality of driver segment circuits, and wherein the pre-driver circuit is configured to supply the first code and the second code to the driver circuit for adjusting output impedance of each of the plurality of pull-up circuits and each of the plurality of pull-down circuits.

15. A method of calibrating a driver circuit in an integrated circuit, comprising:
   generating a value for a first code by calibrating a first impedance in a first reference driver against a reference resistor in the integrated circuit;
   generating a value for a second code by calibrating a second impedance in a second reference driver against the first impedance;
   adjusting the value of the first code to match the first impedance with the second impedance;
   supplying the first code and the second code to the driver circuit for adjusting output impedance of a pull-up circuit and a pull-down circuit therein.

16. The method of claim 15, wherein the step of generating the value for the first code comprises:
   turning off a pull-down circuit, and supplying a third code to a pull-up circuit, in the first reference driver;
   incrementing the third code by one until a first voltage comparator, which compares an output of the first reference driver and an output of a voltage reference circuit, asserts a first trip signal, where the reference resistor is coupled between the output of the first reference driver and a ground node; and
   setting the value of the first code to the value of the third code.

17. The method of claim 16, wherein the step of generating the value for the second code comprises:
   supplying the first code to a pull-up circuit in the second reference driver, and the second code to a pull-down circuit in the second reference driver; and
   incrementing the second code by one until the second code becomes saturated.

18. The method of claim 17, wherein the step of adjusting comprises:
   decrementing the first code until a second voltage comparator, which compares an output of the second reference driver and the output of the voltage reference circuit, asserts a second trip signal.

19. The method of claim 15, wherein the step of generating the value for the first code comprises:
   turning off a pull-up circuit, and supplying a third code to a pull-down circuit, in the second reference driver;
   incrementing the third code by one until a first voltage comparator, which compares an output of the second reference driver and an output of a voltage reference circuit, asserts a first trip signal, where the reference resistor is coupled between the output of the second reference driver and a supply node; and
   setting the value of the second code to the value of the third code; and
   wherein the step of generating the value for the second code comprises:
   supplying the first code to a pull-up circuit in the first reference driver, and the second code to a pull-down circuit in the first reference driver; and
   incrementing the first code by one until the first code becomes saturated.

20. The method of claim 19, wherein the step of adjusting comprises:

decrementing the second code until a second voltage comparator, which compares an output of the first reference driver and the output of the voltage reference circuit, asserts a second trip signal.

* * * * *